United States Patent [19]
Sato et al.

[11] Patent Number: 5,234,105
[45] Date of Patent: Aug. 10, 1993

[54] PACKAGES FOR CIRCUIT BOARDS FOR PREVENTING OXIDATION THEREOF

[75] Inventors: Syoji Sato, Neyagawa; Yasuo Izumi, Ikoma; Kazumi Ishimoto, Katano; Yutaka Makino, Kobe, all of Japan

[73] Assignee: Matsushita Electric Industrial Co., Ltd., Kadoma, Japan

[21] Appl. No.: 982,041

[22] Filed: Nov. 24, 1992

Related U.S. Application Data

[63] Continuation of Ser. No. 657,786, Feb. 21, 1991, abandoned.

[30] Foreign Application Priority Data

Feb. 22, 1990 [JP]  Japan .................................. 2-41779

[51] Int. Cl.⁵ .................. B65D 73/02; B65D 81/24
[52] U.S. Cl. .................. 206/330; 206/213.1; 206/332; 206/524.8
[58] Field of Search ........... 206/328, 330, 332, 334, 206/213.1, 524.8; 174/250; 361/397

[56] References Cited

U.S. PATENT DOCUMENTS

| | | | |
|---|---|---|---|
| 2,160,367 | 5/1939 | Maxfield | 206/524.8 X |
| 3,313,084 | 4/1967 | Forman | 206/45.33 X |
| 3,700,089 | 10/1972 | Halbartschlager et al. | |
| 3,756,399 | 9/1973 | Cosier et al. | 206/328 X |
| 4,557,379 | 12/1985 | Lane et al. | 206/328 |
| 4,601,157 | 7/1986 | Adelman | |
| 4,736,841 | 4/1988 | Kaneko et al. | 206/332 |
| 5,033,615 | 7/1991 | Shima et al. | 206/328 |

FOREIGN PATENT DOCUMENTS

| | | | |
|---|---|---|---|
| 2125966 | 12/1971 | Fed. Rep. of Germany | |
| 01-39370 | 5/1989 | Japan | 206/328 |
| 556769 | 10/1974 | Switzerland | |

*Primary Examiner*—Bryon P. Gehman
*Attorney, Agent, or Firm*—Wenderoth Lind & Ponack

[57] ABSTRACT

A package is used for keeping an electric circuit board with no electronic components provided thereon in an air-tight cavity thereof and for preventing from oxidation during the transportation to the process wherein the electronic components are mounted on the electric circuit board. The cavity is composed of the lower and upper sheet of gas-impermeable materials, which are bonded at the bonded area by the fusion bonding, adhesive agent or viscous agent. The cavity is kept in non-oxidizing atmosphere by filling inert gas or evacuating air therefrom. The lower and upper sheets are composed of single layer or multi-layers, which may be made of flexible material or rigid material. An electric circuit board accommodated in the cavity of the package is taken out by the device comprising a separation roller pair. The device weakens the bonding strength to enable easy pulling of the lower and upper sheets to unpackage the circuit board.

9 Claims, 6 Drawing Sheets

PACKAGES FOR CIRCUIT BOARDS FOR PREVENTING OXIDATION THEREOF

This application is a continuation of now abandoned application Ser. No. 07/657,786, filed on Feb. 21, 1991abandoned.

BACKGROUND OF THE INVENTION

1. Field of the Invention

The present invention relates to a package for use in transportation of an electric circuit board and from which an electric circuit board can be taken out and, more particularly, to a package capable of keeping an electric circuit board to have mounted thereon various kinds of electronic components in good condition during a time period from the time when the circuit board is only a substrate to the time when the circuit board is completed with various electronic components mounted thereon and from which package the circuit board can be taken out.

2. Description of the Prior Art

An electric circuit board has an electric circuit of conductive metal such as copper formed on a substrate made of resin, glass or ceramics. The electric circuit board has various kinds of electronic parts including semiconductor elements and other electronic components such as resistors, capacitors or reactors mounted thereon to connect them to each other. Usually, processes for manufacturing an electric circuit board provided with an electric circuit on the substrate are performed in a factory or company other than that where processes for mounting various kinds of electronic components on the electric circuit board is performed. Therefore, an electric circuit board having no electronic parts mounted thereon is merchandized and sold and is required to be stored temporally and transported in the market.

A conductive metal such as copper which is forming an electric circuit of the electric circuit board is easily oxidized by air, causing difficulties of a soldering in a later process and difficulties in functioning to achieve its desired electrical characteristics. Furthermore, a recognition mark is usually formed in a pattern by the conductive metal on the substrate at the same time when the electric circuit is formed thereon, which recognition mark is utilized, in a later process, to detect the circuit position on the substrate. However, if the conductive material is oxidized, the recognition mark of the conductive metal deforms and makes it difficult for an image recognition machine to detect the recognition mark correctly. Therefore it is important to prevent the conductive metal from being oxidized during storage or transportation of the electric circuit board.

A solder plating or pre-flux is applied to the electric circuit to cause it not to react with air, which is conventionally employed to prevent the electric circuit from being oxidized. In addition to the above described effect to protect the conductive metal against the oxidation by air, a solder plating and pre-flux application have the following advantages. In the solder plating application, it is not necessary to remove the solder plating from the electric circuit board for a later process because various kinds of electronic components are fixed to the circuit board by a solder connection in the later process. In the pre-flux application, the pre-flux functions in two ways: one is to prevent the electric circuit from being oxidized until the electric circuit board reaches a process to mount electronic components thereon, and the other is to promote the soldering ability in the later process to solder the electronic components to the electric circuit board.

However, the previous two methods for preventing the conductive metal of the circuit board from being oxidized have a bad effect on the later process. The solder plating method is executed by applying the solder plating all over the surface of conductive metal including an electric circuit and a recognition mark and results in a very high cost. When the electronic components and other parts are mounted on the circuit board by soldering at a later process, there appears a disadvantage that a soldering position is not determined exactly. This results in a miss-mounting of electronic components and other parts or degradation in the accuracy of the soldering position. The method using the pre-flux is usually carried out in a way that a desired solder pattern is formed on the pre-flux layer by a screen printing method. The electronic components and other parts are put on the pre-flux layer and are connected to the circuit by a solder refloat process. During the solder refloat process, the pre-flux between the surface of the circuit boards and the solder is heated to a boil and then the electronic components and other parts are separated from the surface of the circuit board. This results in a problem that it is not possible to ensure the soldering between the electronic components and the circuit board. When the method using the pre-flux is used for a circuit board having an electric circuit on both sides, another problem appears. While one side of the circuit board is initially subjected to the solder refloat process, the whole circuit board is heated to a higher temperature and then the pre-flux on the other side loses its flux function. When the other side of the circuit board is next subjected to the solder refloat process, the pre-flux on the other side does not act as a useful flux and degrades the soldering connection.

On the other hand, one may consider another method in which a circuit board is not subjected to a treatment for preventing the oxidation of the conductive metal. The oxidized conductive metal is reduced to metal by a flux having a strong reduction ability before a process of soldering electronic components and other parts in a way described above. However, such a flux generates a halogen compound during the soldering process. The halogen compound must be finally removed by a cleaning process using, for example, flon. This is not desirable in view of the environmental safety.

SUMMARY OF THE INVENTION

The object of the present invention is therefore to provide a package for electric circuit boards and from which and electric circuit board can be taken out which solves these problems.

The present invention has been developed with a view to substantially solving the above described disadvantages and has for its essential object to provide an improved package for circuit board therein and from which the circuit board can be taken out.

According to the present invention, a package for keeping an electric circuit board in a non-oxidation atmosphere comprises a lower sheet made of gas impermeable material, an upper sheet made of gas impermeable material, a bonded area formed on the periphery of the opposed surfaces of the lower sheet and the upper sheet, a cavity for accommodating the electric circuit board formed by the lower sheet and the upper sheet and enclosed by the bonded area in an air tight manner, and means for providing a non-oxidation atmosphere in the cavity.

BRIEF DESCRIPTION OF THE DRAWINGS

These and other objects and features of the present invention will become clear from the following description of the preferred embodiments thereof with reference to the accompanying drawings throughout which like parts are designated by like reference numerals, and in which.

DETAILED DESCRIPTION OF THE PREFERRED EMBODIMENTS

Figure 1:
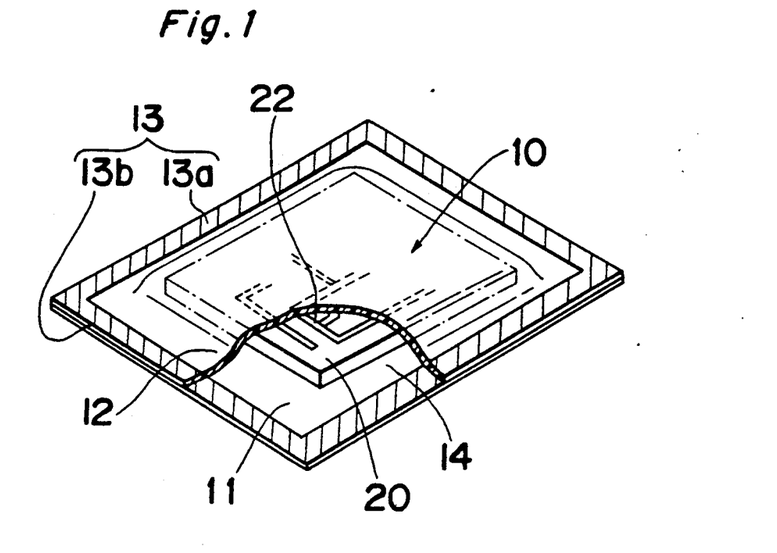
FIG. 1 is a perspective view, partly broken away of a package having an electric circuit board accommodated therein according to the present invention.

Referring to FIG. 1, a package 10 according to the present invention is shown, which includes a lower sheet 11 and an upper sheet 12 which are made of a transparent and thin film or sheet material (both sheet and film material are referred to as a sheet hereinafter) in a rectangle form and are adhered to each other at the periphery by a fusion bonding technique so as to form a bonded area 13. The bonded area 13 is provided in the shaded area shown in FIG. 1. The lower and upper sheets 11 and 12 are made of a gas impermeable material which prevents gas such as oxygen from seeping therethrough. A cavity 14 is formed as a thin space between the lower sheet 11 and upper sheet 12, and is surrounded by the bonded area 13. The cavity 14 encloses a circuit board 20 formed in a rectangular shape.

The circuit board 20 is provided with an electric circuit 22 composed of a conductive metal, such as a copper, which may be easily oxidized. The circuit 22 need not be coated with any oxidation preventive treatment such as a pre-flux or solder plating, and thus is covered with nothing. Therefore the conductive metal of circuit is bare.

According to the present invention, the cavity 14 is in a vacuum state or filled with a non-oxidizing, inert gas such as nitrogen, to protect the conducting metal from oxidization.

The circuit board 20 enclosed in the package 10 has a usual structure and is made of a conventional material used in the usual electronic devices. For example, a circuit board having either a circuit on one side or on both sides, or a plurality of circuits integrated therein can be used. The circuit board has a substrate composed of resin, glass or ceramics which is commonly used in electronic devices. Copper is used in the electric circuit 22 as the conductive material, but is easy to be oxidized. Other metals are also usable. Furthermore, any other metal resistant to oxidation such as gold is usable for the circuit 22 in combination with the conductive and easy to be oxidized metal.

The substrate of circuit board 20 can be in an arbitrary thickness and size in accordance with the desired end use, and is about 0.4–2.0 mm thick as in the usual circuit board for use in mounting of semiconductor elements. As the lower and upper sheets 11 and 12 forming the package 10, such gas impermeable package materials as polypropylene or polyethylene which is widely used in the various field of electronic devices or the package industries are usable. The sheet materials used are about 0.01–0.1 mm thick.

For fusion bonding at the bonded area 13, thermal melting adhesives are used for the lower and upper sheets 11 and 12.

If flexible materials are used for the lower and upper sheet 11 and 12, the package can wrap the circuit board 20 which has some projections.

If a transparent material is used for the lower and upper sheets 11 and 12, it is possible to inspect the circuit board 20 in the cavity 14 visually from the outside of the package 10.

If a plastic material is used for the lower and upper sheets 11 and 12, it is possible to form a concave portion, or a recess, in the sheet 11 or 12 previously and the circuit board 20 is received in the recess thereof.

If a rigid material is used for the lower and upper sheet 11 and 12, it is possible to protect the circuit board 20 inside the package 10 against violent stress from the outside during the transportation. The materials for the lower and upper sheets 11 and 12 can be composed of multi-layers comprising a plurality of synthetic resin or any other materials. The lower and upper sheets 11 and 12 can be composed of the same material or of different materials according to their required function.

As mentioned above, the lower and upper sheets 11 and 12 are adhered to each other at the bonded area 13 to form an air tight cavity 14 by using common means of bonding usual sheet materials such as a viscous agent or adhesive agent besides the fusion bonding technique. The viscous agent or adhesive agent is applied to the lower and upper sheets 11 and 12 only at the portion to form the bonded area 13. Another method is to apply the viscous agent or adhesive agent all over the sheet materials 11 and 12 on the sides facing each other, and to apply heat or pressure only at the portion to form the bonded area 13. The viscous agent or the adhesive agent usually comprises epoxy resin and acrylic resin, for example.

The package 10 is formed by adhering the lower and upper sheets 11 and 12 to each other at the periphery to form the frame-like cavity 14 as shown in FIG. 1. Beside this structure, there are other structures available for the use in the package 10 according to the present invention. One structure is that a sheet material in a pipe form is cut at a given length and is sealed at both ends. Another structure is that a sheet material in a sack form is sealed at the top opening. Various sealing structure, composed of sheet materials, employed in the package industry is usable.

To make the cavity 14 in the package 10 a nonoxidizing atmosphere, the lower and upper sheets 11 and 12, having the circuit board 20 placed therebetween, are adhered to each other tightly at the bonded area 13 in a non-oxidizing atmosphere. But the same result can also be achieved by the following steps: the circuit board 20 is placed in the cavity 14 between the lower and upper sheets 11 and 12 in a normal air environment; the cavity 14 is evacuated or filled with an inert gas through an opening formed in part of the bonded area 13; and the opening is closed in an air tight manner.

It is possible to take out the circuit board 20 from the package 10 by peeling the lower and upper sheets 11 and 12 apart to separate mechanically the bonded area 13 formed by a fusion bonding technique or an adhesive agent, or by cutting off or punching out the lower and upper sheets 11 and 12 along a line inside of the bonded area 13. When the viscous agent used at the bonded area 13 has such a property as to lose its adhesive property under ultraviolet rays, it is possible to separate the lower and upper sheets 11 and 12 from each other by irradiating the ultraviolet rays at the bonded area 13.

The package 10 usually has one circuit board 20 enclosed therein. However, it is possible to receive a plurality of circuit boards 20 in one cavity 14 thereof or to make a plurality of cavities adjacent each other within one package 10. In either case, each cavity 14 accommodates one circuit board 20 in an air tight manner. The cavities 14 forming a package 10 may be aligned in a line as in a belt, or they may be aligned vertically and horizontally in a plane.

Figure 2:
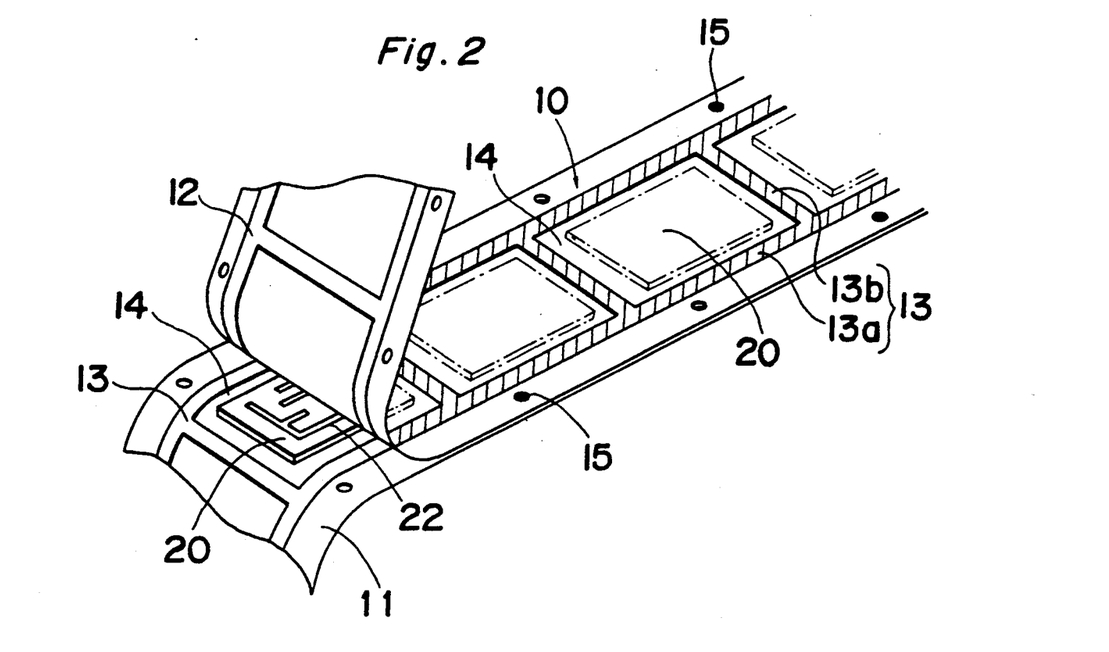
FIG. 2 is a perspective view of a package having a plurality of neighboring cavities in which each one of electric circuit board is accommodated according to the present invention, wherein said package is partly opened.
Figure 3:
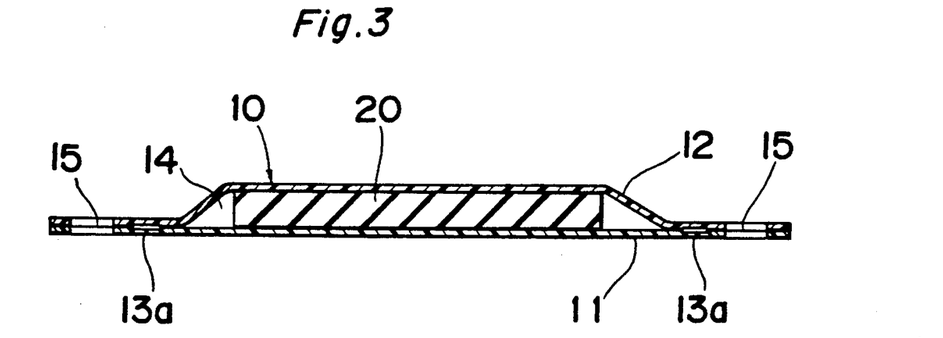
FIG. 3 is a schematic sectional view of a package having an electric circuit board accommodated therein on a large scale according to the present invention.

Referring to FIGS. 2 and 3, a package 10 in a long rectangular form is shown, which has a plurality of cavities 14 formed individually therein. I each of cavities 14, a circuit board 20 is accommodated. The package 10 is formed by the lower and upper sheet 11 and 12 in a long rectangular form adhered to each other at a bonded area 13. The bonded area 13 has a form of a ladder defined by two opposing parallel portions 13a and crossing portions 13b extending between the parallel portions 13a.

The package 10 having the bonded area 13 in a ladder form has a plurality of spaces enclosed therein. Each space acts as a cavity 14 and encloses a circuit board 20 in an air tight manner. The package 10 has perforations 15 at a given pitch along opposite sides and outside the bonded area 13a. The perforations 15 are utilized for the continuous conveyance of the lower and upper sheets 11 and 12 when the package 10 is produced. During the continuous conveyance, the lower and upper sheets 11 and 12 receive the circuit boards 20 and are adhered to each other at the bonded area 13. As will be described later, the perforations 15 are also used for automatic conveyance of the lower and upper sheets 11 and 12 together at the time when the circuit boards 20 are taken out from the package 10.

As shown in FIG. 3, the lower sheet 11 is flat and stiff while the upper sheet 12 is flexible and deformed around the shape of the circuit board 20. In such a way, it is preferable to employ the lower sheet 11 and upper sheet 12 having a combination of material qualities suitable for the aimed function.

The package 10 described above has a structure to bond the lower and upper sheets 11 and 12. Such a structure makes it easy to take out the circuit board 20 from the package 10 by separating mechanically the lower and upper sheets 11 and 12. A package material in a pipe form can have a circuit board 20 inserted through one opening and be sealed repeatedly at a given distance to form the plurality of cavities 14 each of which has a circuit board 20 enclosed therein.

The lower sheet 11 and upper sheet 12 of long sheet material can form a bonded area 13 in a ladder form in the following way. During the continuous conveyance of the lower and upper sheets 11 and 12, the sheets 11 and 12 are adhered continuously at the both side edges through a fusion bonding technique using a heating roller and are simultaneously bonded along a line crossing the sheets 11 and 12 with a heater which presses intermittently against the sheets 11 and 12 along a line at a given distance from neighboring lines. In this way the bonded area 13 in a ladder form is obtained.

Another way to make the bonded area 13 in a ladder form is that the sheets 11 and 12 are repeatedly heated with a heater having a frame with a configuration which is the same as that of one block of the bonded area 13 in a ladder form. The package 10 in a ladder pattern shown in FIG. 2 is preferable from the viewpoint of the continuous manufacturing and the small area of the bonded area 13. However, other patterns of the bonded area 13, such as independent rectangles aligned in a line may be used.

It is possible to make independently a cavity 14 between the lower and upper sheets 11 and 12. Any other package method or mechanism available for various items can be used for the manufacturing method of the package according to the present invention.

Figure 4:
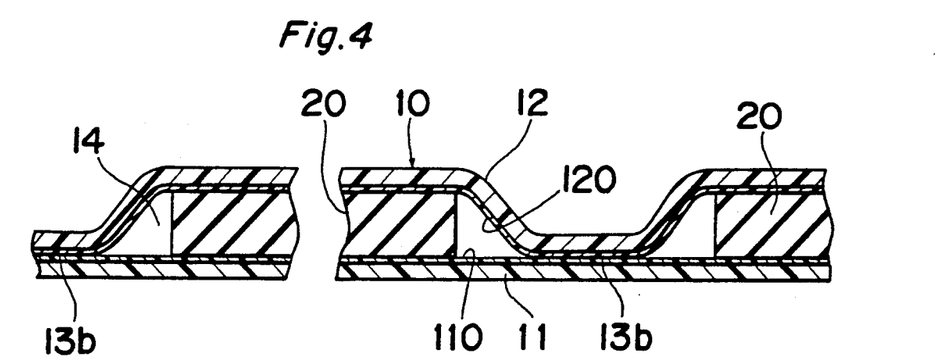
FIG. 4 is a schematic sectional view of an alternative form of the package on a large scale in which the lower and upper sheet are composed of additional adhesive layers according to the present invention.

Referring to FIG. 4, another embodiment according to the present invention is shown, in which a package 10 in a long sheet has a plurality of cavities 14 formed individually therein through an operation of an adhesive agent but not through an operation of thermal melting adhesion. The materials of lower and upper sheets 11 and 12 are over-coated at the both sides facing each other with adhesive layers 110 and 120.

The lower and upper sheet materials have a plurality of circuit boards 20 inserted therebetween and are pressed at a bonded area 13 at which the lower and upper sheets 11 and 12 adhere to each other so as to make a package 10 having a plurality of cavities. Thus, the bonded area 13 has a pattern of a ladder. It is necessary to make the adhesion strength of adhesive layers 110 and 120 strong enough. Otherwise the bonded area 13 may be separated during the transportation of the package and consequently the atmosphere in the cavity 14 is changed from the non-oxidizing atmosphere to air. The package in such a structure makes it easier to take out the circuit board 20 by pulling the sheets 11 and 12 apart, than the package having cavities 14 formed by a fusion bonding technique.

Figure 5:
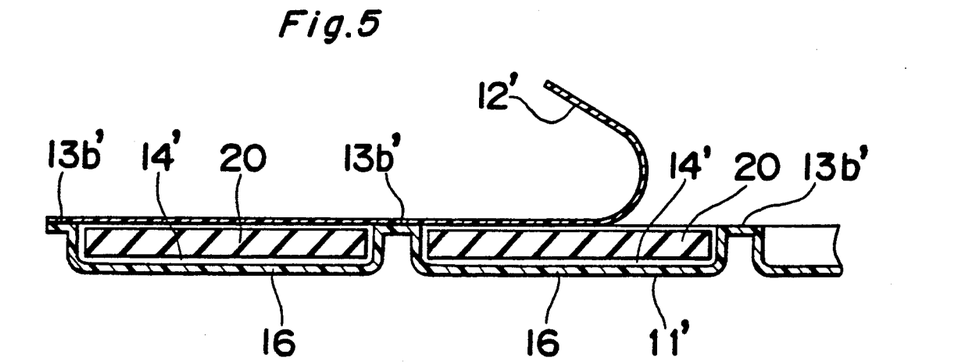
FIG. 5 is a schematic sectional view of an alternative form of the package of the present invention on a large scale in which the lower sheet is composed of rigid material and is formed with a plurality of convex recesses, or cavities, for receiving the electric circuit board.

Referring to FIG. 5, other embodiment according to the present invention is shown, in which a lower sheet 11' is composed of a material having a capability of shape forming and has a recess 16, or convex portion, in a size matching the size of an electric circuit board 20. The recess 16 acts as a cavity 14' similar to the cavity 14 of the above described embodiments. An upper sheet material 12' is composed of a material relatively thin and covers the lower sheet 11'. The lower and upper sheets 11' and 12' are adhered to each other at a bonded area 13' through a fusion bonding technique so as to form a cavity 14' at the recess 16. The package 10 in this structure can ensure the positioning of the circuit board 20. The circuit board 20 is put in the cavity 14' at the recess 16 composed of a rigid material and is protected effectively from external stress.

As explained above, a package 10 shown in FIG. 1 has a circuit board 20 enclosed individually therein. A plurality of packages 10 are packed in any suitable box or container, and are transported or stored. At a time it is desired to use the circuit board 20, the circuit board 20 can be easily taken out from the package 10 by breaking the package 10. In this case it is possible to take out the circuit board 20 automatically by using any suitable machine for the purpose.

A package 10 shown in FIG. 2 is in a long sheet type and can be folded or rolled into a small pack. It is convenient to store or transport the small pack including a plurality of circuit boards 20. When the circuit boards 20 are sold, a long sheet package 10 can be cut into a small package having a given amount of circuit boards 20. It is convenient to handle a small package having a given amount of circuit boards 20 enclosed air-tightly therein.

To take out the circuit boards 20 from the package 10' in a long sheet type, the adhesive force at the bonded area 13 is weakened and the cover sheet 11 is peeled off, while the package 10 in a long sheet type is conveyed continually. Furthermore the used sheets 11 and 12 can be collected at the same time.

Figure 6:
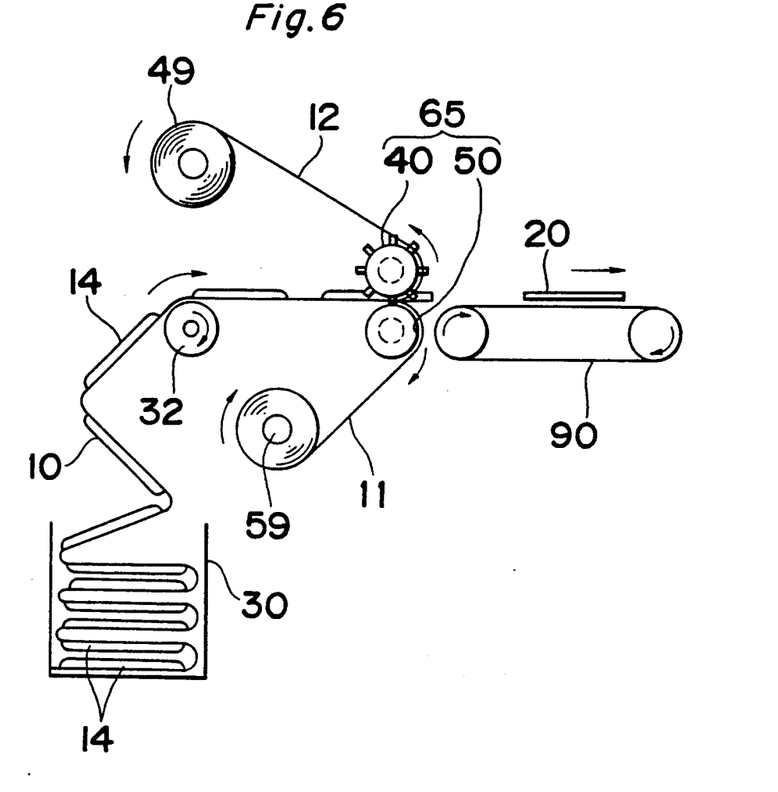
FIG. 6 is a schematic view of an electric circuit board taking out device according to the present invention.

Referring to FIG. 6, a machine for taking out a plurality of circuit boards 20 from a package 10 in a long sheet form is shown. The package 10 in a long sheet form can be folded alternatively at flexible portions between each cavity 14 having the circuit board 20 therein, and is stored in a stock container 30.

The package 10 is pulled out from the stock container 30 from one end of the folded package 10, and is conveyed horizontally over a guide roller 32 toward the gap between an upper roller 40 and a lower roller 50 with each of lower and upper sheets 11 and 12 facing down and up, respectively. The upper roller 40 and the lower roller 50 constitute a pair of separation rollers 65. When the package 10 reaches the separation rollers 65, rollers 40 and 50 pull the upper and lower sheet 12 and 11 so as to separate them. Each of sheets 12 and 11 separated by the separation rollers 65 is conveyed to and wound up by the collection rollers 49 and 59, respectively.

During the separation of the lower and upper sheets 11 and 12, the electric circuit boards 20 are removed from the lower and upper sheets 11 and 12 and carried ahead of the separation rollers 65. The carried circuit board 20 goes into the next process, or station, through a circuit board collection mechanism such as a roller conveyer 90. The machine explained in the above can take out the circuit boards 20 from the package 10 in a long rectangular shape automatically and continuously.

In the above described embodiment, the lower and upper sheets 11 and 12 adhered each other at the bonded area 13 are separated only by pulling the lower and upper sheets 11 and 12 by the lower and upper roller 50 and 40 of separation rollers 65, respectively. This mechanism is applicable only for the package having the bonded area 13 adhered by an adhesive agent which can be easily detached. However, if the package 10 has the bonded area 13 which is firmly bonded by a stronger bonding means such as by the fusion bonding, it is preferable to employ the following apparatuses.

Figure 7:
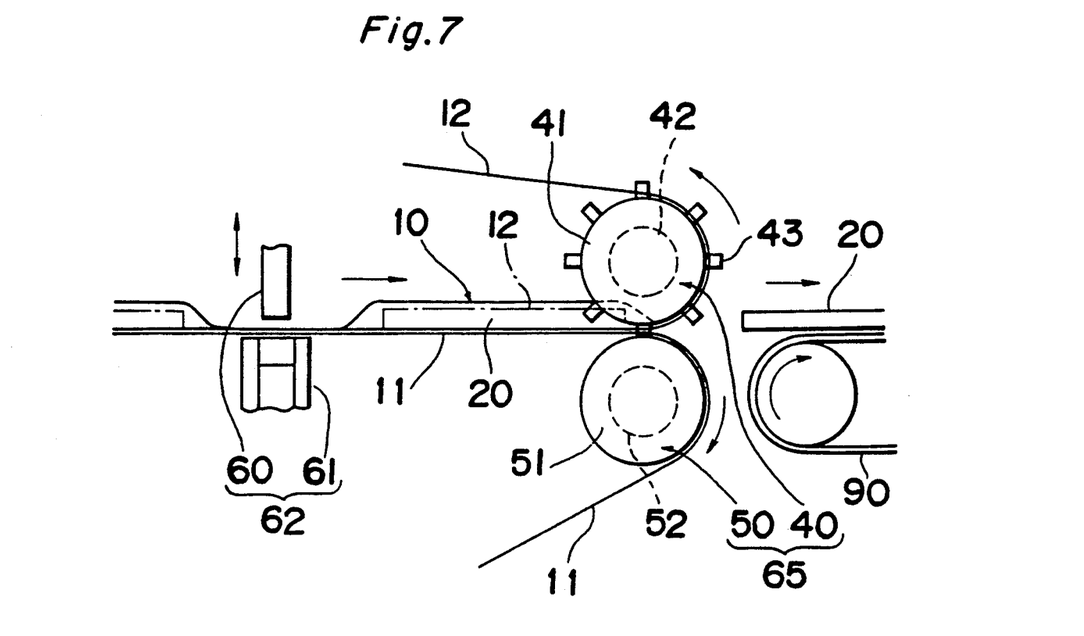
FIG. 7 is a schematic view of an alternative form of the electric circuit board taking out device of FIG. 6 on a large scale, in which a punching device is employed for cutting down the combined part.
Figure 8:
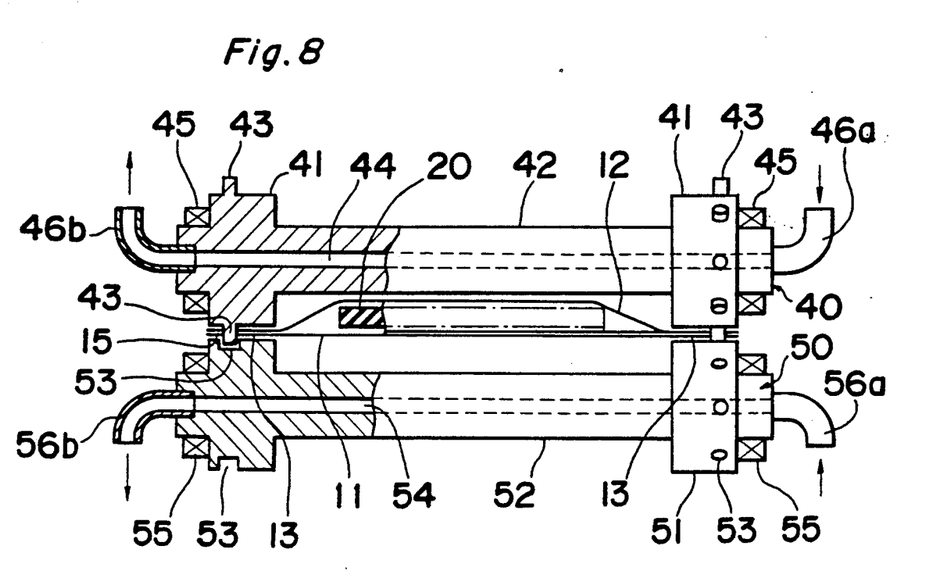
FIG. 8 is a schematic view of a separation roller of FIG. 7, viewed in the package conveyance direction, according to the present invention.
Figure 9:
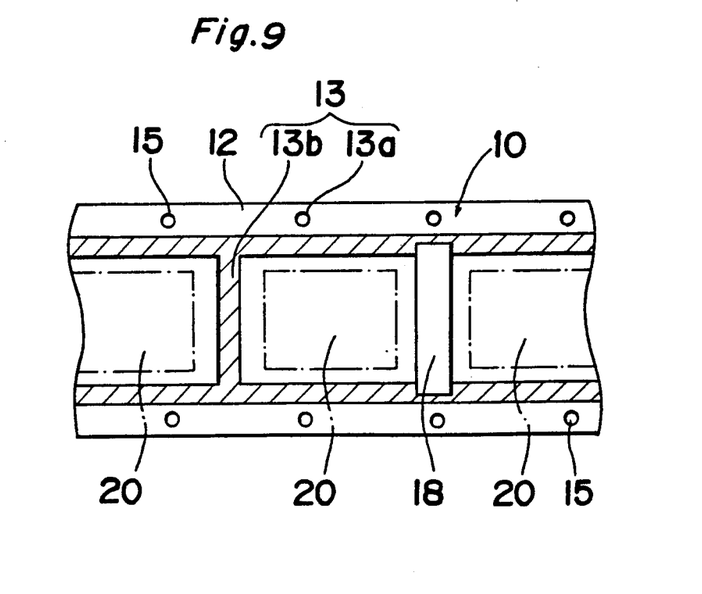
FIG. 9 is a plan view of a portion of a package having a plurality of circuit boards accommodated therein according to the present invention, wherein the cavities are formed in a ladder pattern by the bonded area.

Referring to FIGS. 7, 8 and 9, embodiments of sheet removing apparatus according to the present invention are shown, which have the same basic structure as that of the machine shown in FIG. 6.

According to the apparatus shown in FIG. 7, a cutting device 62 has an upper punch 60 and a lower punch 61 which are provided before the separation rollers 65, such that the package 10 goes through the clearance between the upper punch 60 and the lower punch 61. The upper punch 60 can reciprocate in a vertical direction and fit in the lower punch 61 which is positioned under the upper punch 60. A crossing portion 18 of the package 10 is cut off by the upper punch 60 and the lower punch 61 through the downward movement of the upper punch 60 as shown in FIG. 9.

Referring to FIG. 8, a detailed structure of the separation rollers 40 and 50 is shown. The separation rollers 65 are composed of the upper roller 40 and the lower roller 50. The rollers 40 and 50 are each supported rotatably at the opposite ends with bearings 45 and 55. At each of end rollers 50 and 40, end rolls 41 and 51 of a large diameter are provided adjacent the bearings 45 and 55, respectively. Provided between the end rolls 41 is a central shaft 42 of a small diameter. Similarly, a central shaft 52 is provided between the end rolls 51.

The package 10 is sandwiched between upper and lower rollers 40 and 52 with opposite side ends of the bonded area 13 and perforations 15 pressure fitted between the end rolls 41 and 51. The end roll 41 has sprockets 43, and the end roll 51 has holes 53 for receiving the sprockets 43. The separation rollers 40 and 50 rotate with the rotation of the end rolls 41 and 51 while the sprockets 43 mesh into the corresponding holes 53. The package 10 sandwiched between the separation rollers 40 and 50 is meshed at the perforations 15 by the sprockets 43 of the end roll 41 and is conveyed forward with the rotation of the end roll 41. The package 10 at the cavity 14 for the circuit board 20 goes through the central shaft 42 with a small outside diameter without collision with the separation rollers 40 and 50.

The separation rollers 40 and 50 have through holes 44 and 54 formed along the central axis thereof. The through holes 44 and 54 are connected at the both ends thereof to an external heating source (not shown in the FIG. 8) through rotary joints 46a, 46b, 56a and 56b installed at both ends of separation rollers 40 and 50. A heating medium such as warm air or hot water supplied from the heating source enters into one end of each of the rotary joints 46a and 56a, and exits from the other ends of the rotary joints 46b and 56b. During the circulation of the heating medium in the through holes 44 and 54, the separation rollers 40 and 50 are heated, and the end rolls 41 and 51 are also heated. The package 10 is sandwiched at both sides between the end rolls 41 and 51 of the rollers 40 and 50, respectively. The bonded area 13 is heated at both sides and is released from the adhesion effect of the fusion bonding. The sheet materials 11 and 12 having the bonded area 13 released from the adhesion are conveyed along the separation rollers 40 and 50 and thus are easily separated from each other. The heated end rolls 41 and 51 heat only the side of the bonded area 13 to weaken the adhesion. The crossing portion 18 of bonded area 13 is already cut off. Therefore the separation between the lower and upper sheets 11 and 12 can be easily executed.

According to the above described apparatus, the end rolls 41 and 51 are heated up to a temperature at which the bonded area 13 adhered through a fusion bonding technique is released from the adhesion. The temperature of the heating medium at the heating source is different for the materials of the sheets 11 and 12, but it is sufficient to heat up the heating medium to about 60° to 100° C.

The above embodiment explains the method for releasing the bonded area 13 from the adhesion. The bonded area 13 in a ladder form is cut off at the portion crossing the package 10 with the upper punch 60. The sides of the bonded area 13 are released from the adhesion by heating with heated end rolls 41 and 51. In this way the lower and upper sheets 11 and 12 are separated efficiently from each other during the continuous conveyance of the package 10. Consequently, the circuit board 20 is taken out easily from the package 10.

Figure 10:
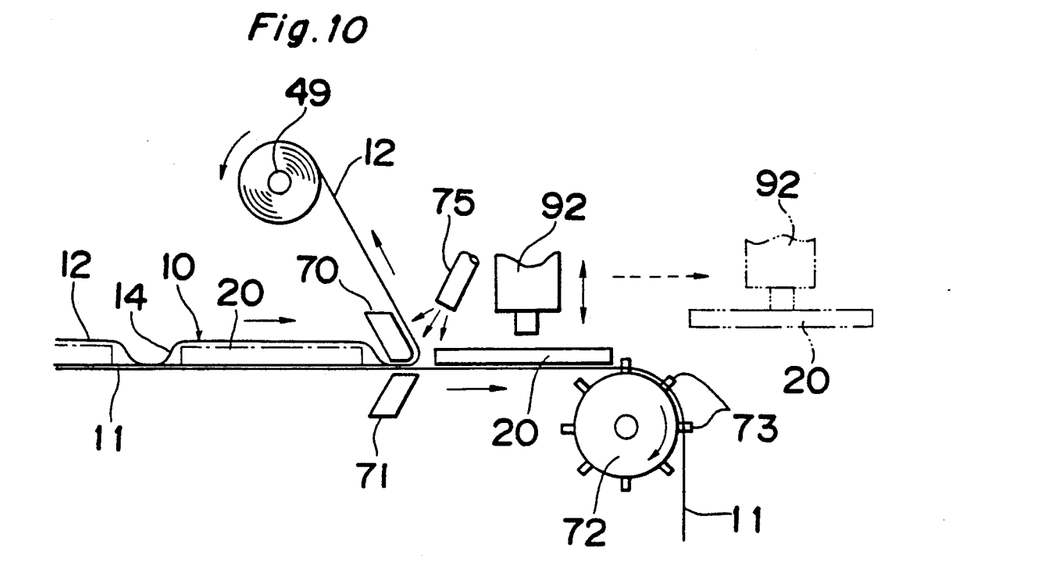
FIG. 10 is a schematic view of an alternative form of the electric circuit board taking out device according to the present invention, wherein an iron heater is provided.

Referring to FIG. 10, an apparatus for taking out the circuit board 20 according to another embodiment is shown. In this embodiment, a heated element 70 at an upper position and a heated element 71 at a lower position are used in place of the separation rollers and can be heated freely. The heated elements 70 and 71 are heated by any heating means such as an electric heater and are formed, for example, of iron. The heated elements 70 and 71 engage the package 10 at both sides thereof and release the bonded area 13 from the adhesion from the fusion bonding technique. After the bonded area 13 is released from the adhesion, the upper sheet material 12 at an upper position is conveyed upward along the heated element 70 and is rolled on a collection roller 49. The lower sheet 11 at a lower position is conveyed horizontally while carrying the circuit board 20 thereon.

An ion generating nozzle 75 is installed at a place where the upper sheet 12 at an upper position is separated from the lower sheet 11. Ions generated from the ion generating nozzle 75 are blown on the upper sheet 12 at the separating portion and remove the static electric charge existing on the package during the operation. This prevents the static electric charge from remaining in the circuit board being carried to the next process.

The circuit board 20 on the upper sheet 12 is picked up from the lower sheet material 11 by an air-suction nozzle mechanism 92 and conveyed to the next station by the movement of the air-suction nozzle mechanism 92. The upper sheet 12 having the circuit board 20 picked up therefrom is collected at a downstream place on a rotating roller 72 equipped with a sprocket 73. The package 10 and the upper sheet 12 are driven by a driving force of the rotating roller 72.

Figure 11:
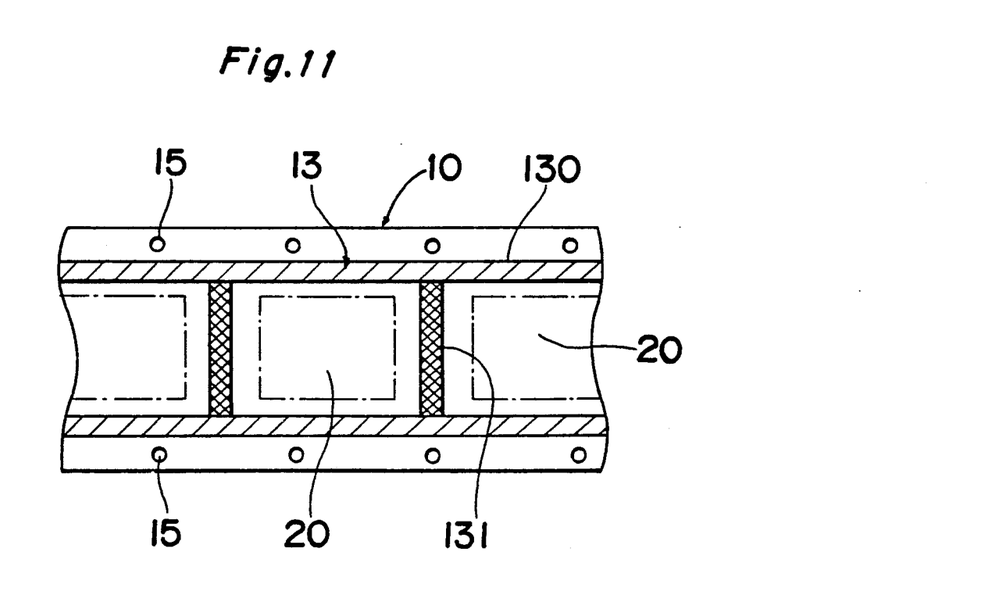
FIG. 11 shows a plan view of a package having two kinds of bonded area according to the present invention.

Referring to FIG. 11, an embodiment according to the present invention providing a modified bonded area is shown. In this embodiment, a bonded area 13b in a ladder form is formed at both sides 130 through a fusion bonding technique, and is bonded at a crossing portion 131 with an adhesive agent. The lower and upper sheets 11 and 12 have adhesive layers 110 and 120 applied thereto as shown in FIG. 4 and are pressed at the crossing portion 131 to be a part of the bonded area 13b. The upper and lower sheets 11 and 12 are adhered to each other at both sides through a fusion bonding technique.

When a circuit board 20 is taken out from a package 10 with such a structure shown in FIG. 11, it is not necessary to cut the bonded portion 13b at the portion 131 by cutting punches such as shown at 60 and 61 in FIGS. 7 and 8. The package 10 shown in FIG. 11 requires operations to release the sides 130 adhered by the fusion bonding with the heated separation rollers 41 and 51 or heated elements 70 and 71. On the other hand, the crossing portion 131 can be easily released from the adhesion by pulling mechanically to separate the sheets 11 and 12 from each other and does not require punching work.

Figure 12:
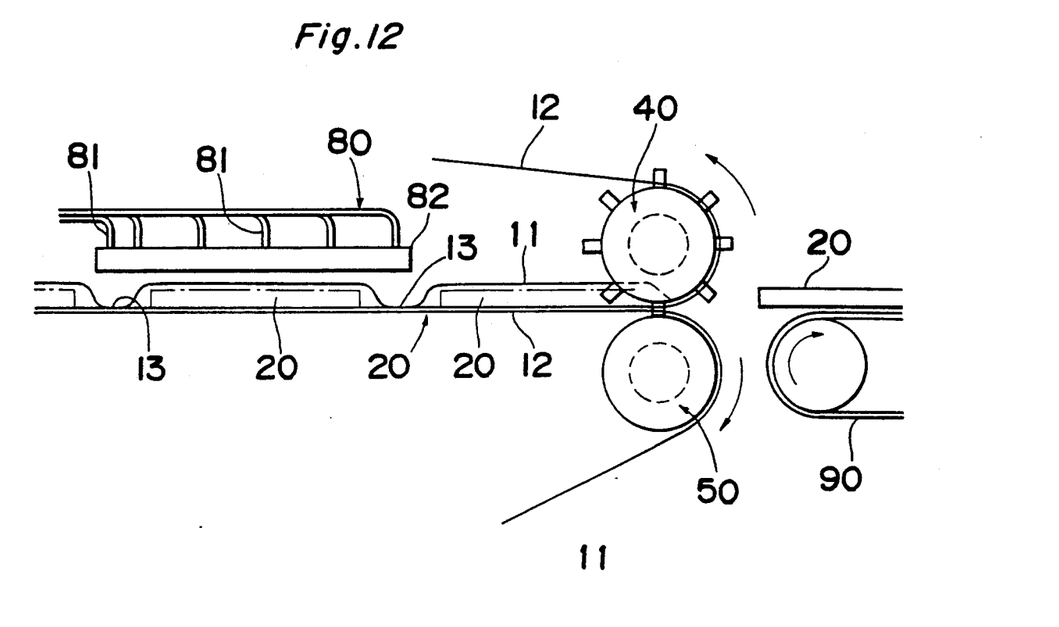
FIG. 12 is a schematic view of an alternative form of the electric circuit board taking out device according to the present invention, wherein an ultraviolet ray irradiation device is provided.
Figure 13:
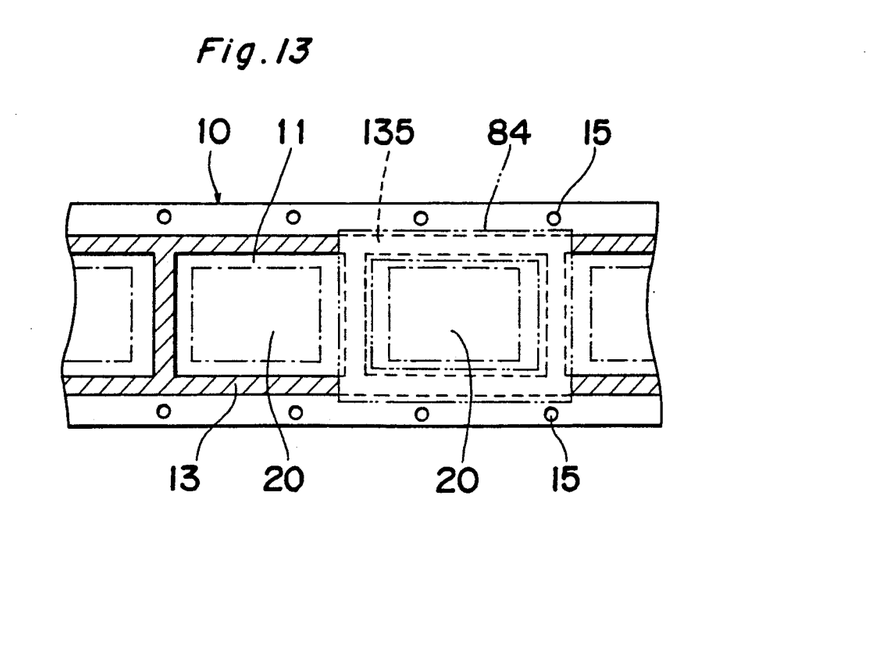
FIG. 13 is a plan view of a package having a plurality of cavities in which can each one of electric circuit board is accommodated according to the present invention, wherein the area to be subjected with an ultraviolet ray irradiation is shown by broken lines.

Referring to FIGS. 12 and 13, an embodiment according to the present invention in which a package 10 is adhered at a bonded area 13 with an adhesive agent which loses adhesion ability under irradiation of ultraviolet light is shown. The package 10 is composed of the lower and upper sheets 11 and 12 having adhesive layers 110 and 120 respectively applied on the surfaces facing each other, as shown in FIG. 4. The adhesive layers 110 and 120 are made of an adhesive agent which loses adhesion ability under irradiation of ultraviolet light.

Separation rollers 40 and 50 for taking out a circuit boards 20 are in a structure essentially similar to those of FIGS. 7 and 8. However, it is not necessary to have a heating means for the separation rollers 40 and 50. An ultraviolet ray irradiation apparatus 80 is installed at a position over a package 20 and in front of the separation rollers 40 and 50. In the ultraviolet ray irradiation apparatus 80, a plurality of optical fibers are arranged along with a supporting frame 81 facing to the surface of a package 10. The plurality of optical fibers are connected to an ultraviolet ray source (not shown in FIG. 12). The plurality of optical fibers 81 irradiate ultraviolet ray in a frame pattern on the package 10.

As shown in FIG. 13, when a bonded area 13 is irradiated with the ultraviolet ray in a frame pattern (shown by imaginary lines) at a bonded area 135 (shown by dotted lines), the adhesive agent loses the adhesion ability. Then, the lower and upper sheets 11 and 12 are released from the adhesion to each other. After that, the sheets 11 and 12 are easily separated from each other by the separation rollers 40 and 50 as described above, and the circuit board 20 is easily taken out from the package 10. The area of the package 10 on which the ultraviolet light is irradiated, where the bonded area 13 loses adhesion ability during one cycle of the ultraviolet light irradiation, is limited to an area of one block of the bonded area 13 surrounding the cavity 14 containing one circuit board 20 therein. The bonded area 13 to be released from adhesion is shifted sequentially synchronized with the movent of the package 10. It is possible to extend the ultraviolet light irradiation area wider than the area of bonded area 13 to be released from the adhesion if the irradiation area covers the necessary area.

The circuit boards 20 taken out from the package 10 through the various methods explained above are used for mounting on usual electronic components. For example, if the circuit board 20 having an adhesive solder screenprinted thereon then has various electronic components mounted on the adhesive solder and followed by a solder refloat treatment, the electronic components are soldered to the electric circuit 22. Furthermore, if a circuit board 20 is of a type with double sides circuit, the electronic components are soldered to the electric circuit of the reverse side in the same way as that on the one side.

It is preferable to execute the solder floating treatment in a non-oxidizing atmosphere such as nitrogen gas in order to protect the conductive metal of the circuit 22 from being oxidized because the conductive metal is exposed, according to the present invention. This method makes it possible to prevent the conductive metal of the circuit 22 from being oxidized during a period from the time when the circuit board has been manufactured to the time when the mounting of electronic components is completed. Therefore it is possible to solder the electronic components without using any flux and thus saves a cleaning operation for removing the flux.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A package for keeping an electric circuit board in a non-oxidation atmosphere, comprising:
   a lower sheet made of an oxygen gas-impermeable material;
   an upper sheet made of an oxygen gas-impermeable material and opposed to said lower sheet;
   a plurality of cavities defined between said lower sheet and said upper sheet and next to each other in a line, each of said cavities being elongated in the direction of the length of said line, and said sheets having a plurality of first bonded area portions between said lower and upper sheets and extending along opposite sides of said sheets, and a plurality of second bonded area portions between said upper and lower sheets and extending transversely of said sheets between said first bonded area portions, said bonded area portions forming a bonded area on the periphery of the surfaces of said sheets around the respective cavities and having the shape of a ladder pattern with said cavities defined in the openings thereof, said cavities being enclosed by respective bonded areas in an air-tight manner;
   an electric circuit board in each of said cavities and having thereon an electric circuit of easily oxidizable conductor material and being free of electric or electronic components at all prints thereon and being unprotected by any coating; and
   a non-oxidation atmosphere in each of said cavities.

2. A package as claimed in claim 1 in which said non-oxidation atmosphere is an inert gas.

3. A package as claimed in claim 1 in which said non-oxidation atmosphere is an air-evacuated atmosphere in said cavities.

4. A package as claimed in claim 1 in which said gas impermeable material is resinous material and said bonded area is fusion-bonded by the application of heat.

5. A package as claimed in claim 1 in which said bonded area is fused and adhered by fusion bonding techniques.

6. A package as claimed in claim 1 in which said upper and lower sheets further comprise viscous and adhesive layers on opposed surfaces thereof at least in said bonded area.

7. A package as claimed in claim 6 in which said lower and upper sheets are press-adhered to each other in said bonded area.

8. A package as claimed in claim 1 in which said lower sheet is made of a rigid material having at least one convex recess therein for receiving said electric circuit board.

9. A package for keeping an electric circuit board in a non-oxidation atmosphere, comprising:
   a lower sheet made of a gas-impermeable material;
   an upper sheet made of a gas-impermeable material and opposed to said lower sheet;
   a plurality of cavities defined between said lower sheet and said upper sheet and next to each other in a line, each of said cavities being elongated in the direction of the length of said line, and said sheets having a plurality of first bonded area portions between said lower and upper sheets and extending along opposite sides of said sheets, and a plurality of second bonded area portions between said upper and lower sheets and extending transversely of said sheets between said first bonded area portions, said bonded area portions forming a bonded area on the periphery of the surfaces of said sheets around the respective cavities and having the shape of a ladder pattern with said cavities defined in the openings thereof, said cavities being enclosed by respective bonded areas in an air-tight manner;
   an electric circuit board in each of said cavities and having thereon an electric circuit of easily oxidizable conductor material and being free of electric or electronic components at all points thereon and being unprotected by any coating; and
   a non-oxidation atmosphere in each of said cavities.

* * * * *

UNITED STATES PATENT AND TRADEMARK OFFICE
CERTIFICATE OF CORRECTION

PATENT NO. : 5,234,105

DATED : August 10, 1993

INVENTOR(S) : Syoji SATO et al.

It is certified that error appears in the above-identified patent and that said Letters Patent is hereby corrected as shown below:

On the title page:

Item [22]      "November 24" read --November 25--.

Signed and Sealed this

Third Day of May, 1994

Attest:

BRUCE LEHMAN

Attesting Officer       Commissioner of Patents and Trademarks